(12) United States Patent
Ito et al.

(10) Patent No.: US 6,694,627 B2
(45) Date of Patent: Feb. 24, 2004

(54) PRINTED CIRCUIT BOARD PROCESSING MACHINE

(75) Inventors: Yasushi Ito, Ebina (JP); Akira Irie, Ebina (JP)

(73) Assignee: Hitachi Via Mechanics, Ltd., Kanagawa (JP)

( * ) Notice: Subject to any disclaimer, the term of this patent is extended or adjusted under 35 U.S.C. 154(b) by 0 days.

(21) Appl. No.: 09/840,062

(22) Filed: Apr. 24, 2001

(65) Prior Publication Data

US 2002/0152619 A1 Oct. 24, 2002

(51) Int. Cl.[7] .............................................. G01B 5/004
(52) U.S. Cl. ........................ 33/1 M; 33/503; 33/549; 33/555
(58) Field of Search ....................... 33/1 M, 503, 613, 33/645, 549, 555, 560, 557, 548

(56) References Cited

U.S. PATENT DOCUMENTS

| | | | | |
|---|---|---|---|---|
| 2,080,643 A | * | 5/1937 | Walther | 408/46 |
| 4,233,740 A | * | 11/1980 | Bunn et al. | 33/1 M |
| 4,551,919 A | * | 11/1985 | Sakata et al. | 33/1 M |
| 4,596,067 A | * | 6/1986 | Raiteri | 408/46 |
| 4,852,267 A | * | 8/1989 | Tezuka | 33/503 |
| 5,888,268 A | * | 3/1999 | Bando | 33/1 M |
| 6,157,157 A | * | 12/2000 | Prentice et al. | 33/1 M |
| 2001/0019686 A1 | * | 9/2001 | Nagawawa et al. | 408/46 |

FOREIGN PATENT DOCUMENTS

| | | | | |
|---|---|---|---|---|
| JP | 359191619 A | * | 10/1984 | 33/1 M |
| JP | 1058405 | | 3/1989 | |
| JP | 04002437 A | * | 1/1992 | 408/46 |
| JP | 04341262 | * | 11/1992 | 408/46 |

* cited by examiner

Primary Examiner—Christopher W. Fulton
Assistant Examiner—Travis Reis
(74) Attorney, Agent, or Firm—Crowell & Moring LLP

(57) ABSTRACT

A printed circuit board processing machine has: a table that can travel in a X-direction carrying a printed circuit board thereon; a cross rail arranged so as to straddle the table; a plurality of sliders supported for independently movement in a Y-direction by the cross rail; a plurality of spindles supported for movement in a Z-direction by the sliders; a magnetic rail of a linear-motor fixed to the cross rail; and a plurality of coils of the linear-motor fixed to the sliders so as to oppose the magnetic rail.

2 Claims, 7 Drawing Sheets

PRINTED CIRCUIT BOARD PROCESSING MACHINE

BACKGROUND OF THE INVENTION

The present invention relates to a printed circuit board processing machine and more particularly to a printed circuit board processing machine suitable for independently controlling a plurality of spindles to reduce the machining time of printed circuit boards to improve machining efficiency.

In drilling of printed circuit boards, reduction of drilling time has almost reached its limits. Therefore, in order to further reduce machining time and improve machining efficiency, it is necessary to reduce traveling time of the spindle that travels among machining positions.

Therefore, a printed circuit board processing machine in which a plurality of machining zones are set along a spindle travel direction (Y direction) on a single printed circuit board and spindles respectively corresponding to the machining zones are arranged for independently movement to shorten traveling distances of the spindles are shorten of the spindles, thereby improving machining efficiency is proposed in, for example, JP-A-64-58405. This printed circuit board processing machine has a structure shown in FIG. 7.

Reference numeral 1 denotes a bed. A table 2 is moveably supported by guide means 3 fixed to the bed 1 so that it can travel in a direction of arrow X, and is driven by a feed screw mechanism including a feed screw 4. Drill supply devices 5R, 5L are fixed to the table 2 with a predetermined interval.

A cross rail 6 is fixed to the bed 1 so as to straddle the table 2. Sliders 7R, 7L are supported for movement in an arrow Y by guide means 8 fixed to the cross rail 6, and are independently driven by respective feed screw mechanisms including respective feed screws 9R, 9L and motors 10R, 10L.

Saddles 11R, 11L are supported for movement in an arrow Z by respective guide means 12 fixed to sliders 7R, 7L, and are driven by respective feed screw mechanisms each of including a feed screw 13 and a motor 14.

Spindle units 15R, 15L, each of which comprises a spindle provided with a chuck for detachably supporting a drill as well as a motor for rotationally driving the spindle, are respectively supported by saddles 11R, 11L. A printed circuit board 16 is placed on the table 2 and is machined.

With this structure, the machining zone of the printed circuit board 16 is divided into a left zone and a right zone at a substantial center thereof. The spindle unit 15R processes the right machining zone and the spindle unit 15L processes the left machining zone. Thus, it is possible shorten the travel distance of each spindle unit 15R, 15L necessary for machining the printed circuit board 16 by half of the structure in which the entire machining zone is processed by a single spindle unit. Also, since it is possible to independently locate the spindle units 15R, 15L for machining, machining efficiency can be improved.

However, since this machine drives multiple sliders independently, the feed screw mechanisms for driving the sliders in the Y direction must be provided as many as the number of sliders. Consequently, it becomes difficult to secure space for feed screw mechanisms on the cross rail if the number of sliders is three or more. It is also difficult to keep the precision of three or more feed screw mechanisms uniform.

SUMMARY OF THE INVENTION

In the light of the circumstances described above, an object of the present invention is to provide a printed circuit board processing machine capable of using three or more spindle units independently driven in the Y direction and further improving machining efficiency.

A printed circuit board processing machine according to the present invention comprises a table that can travel in a X-direction carrying a printed circuit board thereon; a cross rail arranged so as to straddle the table; a plurality of sliders supported for independently movement in a Y-direction by the cross rail; a plurality of spindles supported for movement in a Z-direction by the sliders; a magnetic rail of a linear-motor fixed to the cross rail; and a plurality of coils of the linear-motor fixed to the sliders so as to oppose the magnetic rail.

The printed circuit board processing machine further comprises a linear encoder fixed to the cross rail; a plurality of linear encoder heads fixed to the sliders so as to correspond to the linear encoder; a plurality of first dogs for returning to home positions, fixed to the cross rail so as to correspond to the sliders; a plurality of first sensors fixed to the sliders so as to correspond to the first dogs; a plurality of second dogs for interference prevention, fixed to one of adjacent sliders; and a plurality of second sensors fixed to the other of the adjacent sliders so as to correspond to the second dogs.

BRIEF DESCRIPTION OF THE DRAWINGS

Other objects, advantages and novel features of the present invention will become apparent from the following detailed description of the invention when considered in conjunction with the accompanying drawings.

DETAILED DESCRIPTION OF THE PREFERRED EMBODIMENT

A preferred embodiment of the invention will be described hereinafter with reference to the accompanying drawings.

Figure 7:
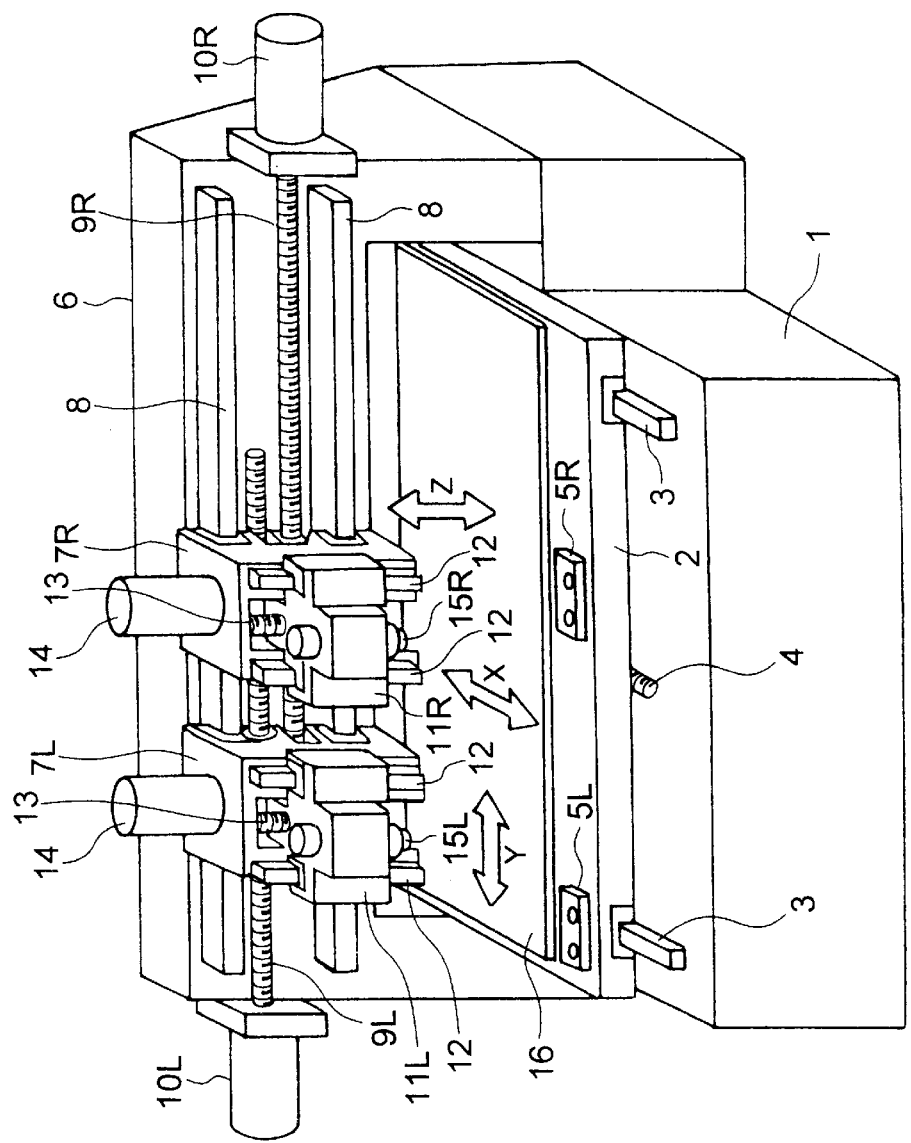
FIG. 7 is a perspective view of a prior art printed circuit board processing machine.

FIGS. 1 to 5 show an embodiment of the present invention, in which the same components as those of FIG. 7 are denoted by the same reference numerals. A slider 7c is supported for movement in a direction of an arrow Y by guide means 8 fixed to a cross rail 6. A saddle 11C is supported for movement in a direction of an arrow Z by guide means 12 fixed to the slider 7C and is driven by a feed screw mechanism including a feed screw 13 and a motor 14. A spindle unit 15C comprises a spindle provided with a chuck for detachably supporting a drill and a motor for rotationally driving the spindle and is supported by the saddle 11C.

A linear-motor rail 17 made of magnetic material is fixed to the cross rail 6 in parallel to the guide means 8. Linear-motor coils 18R, 18C, 18L are respectively fixed to the sliders 7R, 7C, 7L so as to oppose the rail of magnetic material 17. Stoppers 19 are fixed to the cross rail 6 so as to position at both ends of the rail of magnetic material 17.

Dogs 20R, 20C, 20L for returning to home positions are fixed to the cross rail 6. Brackets 21 are respectively fixed to the sliders 7R, 7C, 7L. Sensors 22R, 22C, 22L comprise transmission optical sensors, and are respectively fixed to the brackets 21 so as to correspond to the dogs 20R, 20C, 20L.

A linear encoder 23 is fixed to the cross rail 6 in parallel to the guide means 8. Linear encoder heads 24R, 24C, 24L are respectively fixed to the sliders 7R, 7C, 7L so as to correspond to the linear encoder 23.

Dogs 27R, 27C for interference prevention are respectively fixed to the sliders 7R, 7C. Sensors 26C, 26L comprise transmission optical sensors, are respectively fixed to the sliders 7C, 7L via brackets 25C, 25L so as to correspond the dogs 27R, 27C.

Figure 1:
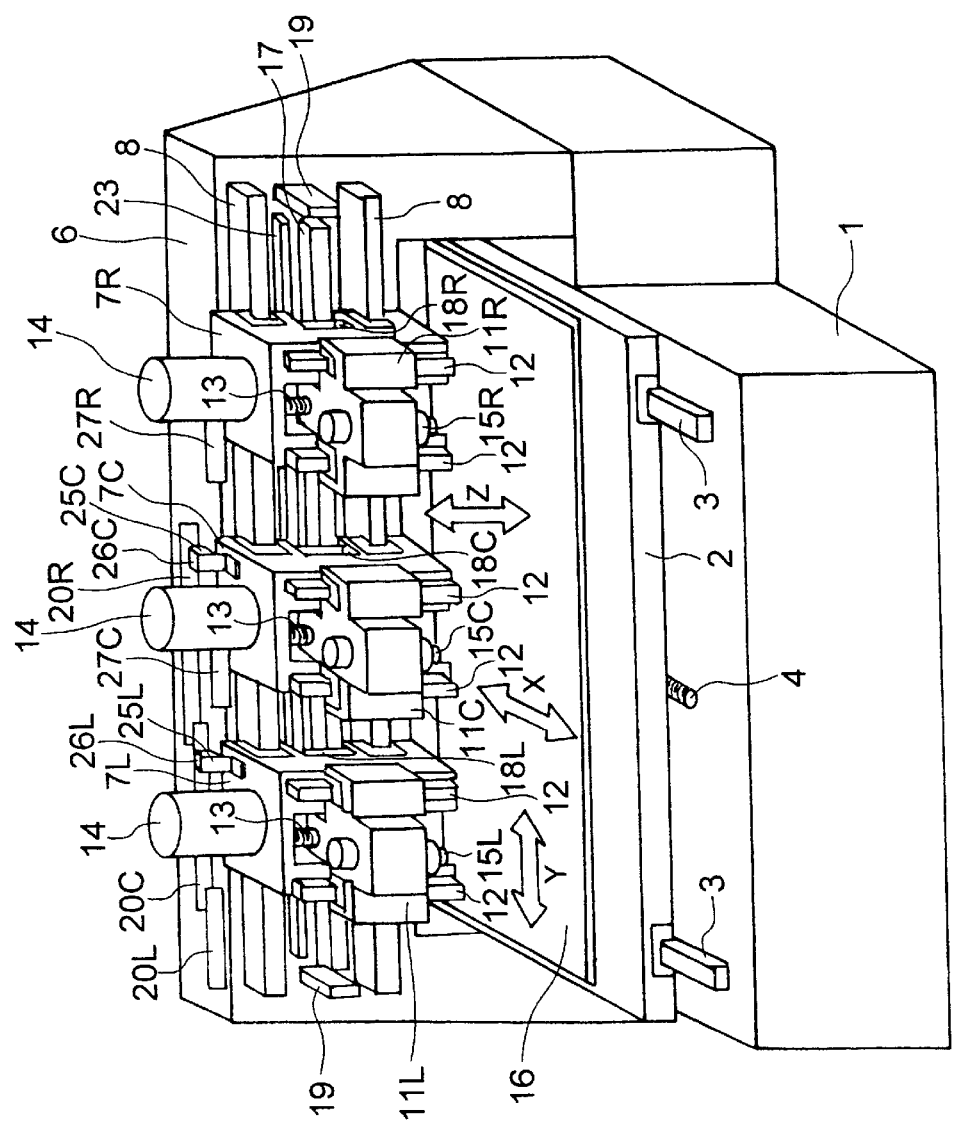
FIG. 1 is a perspective view of a printed circuit board processing machine according to the present invention.
Figure 2:
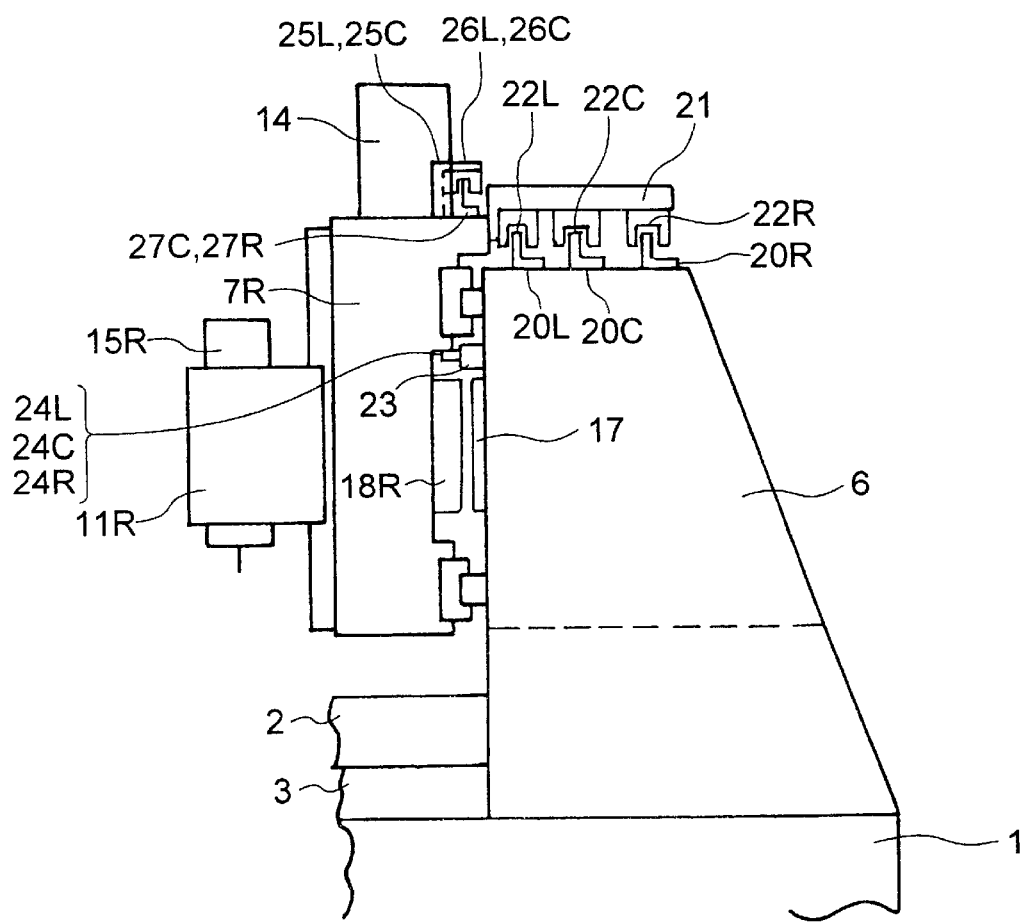
FIG. 2 is a side view of a cross rail shown in FIG. 1.
Figure 3:
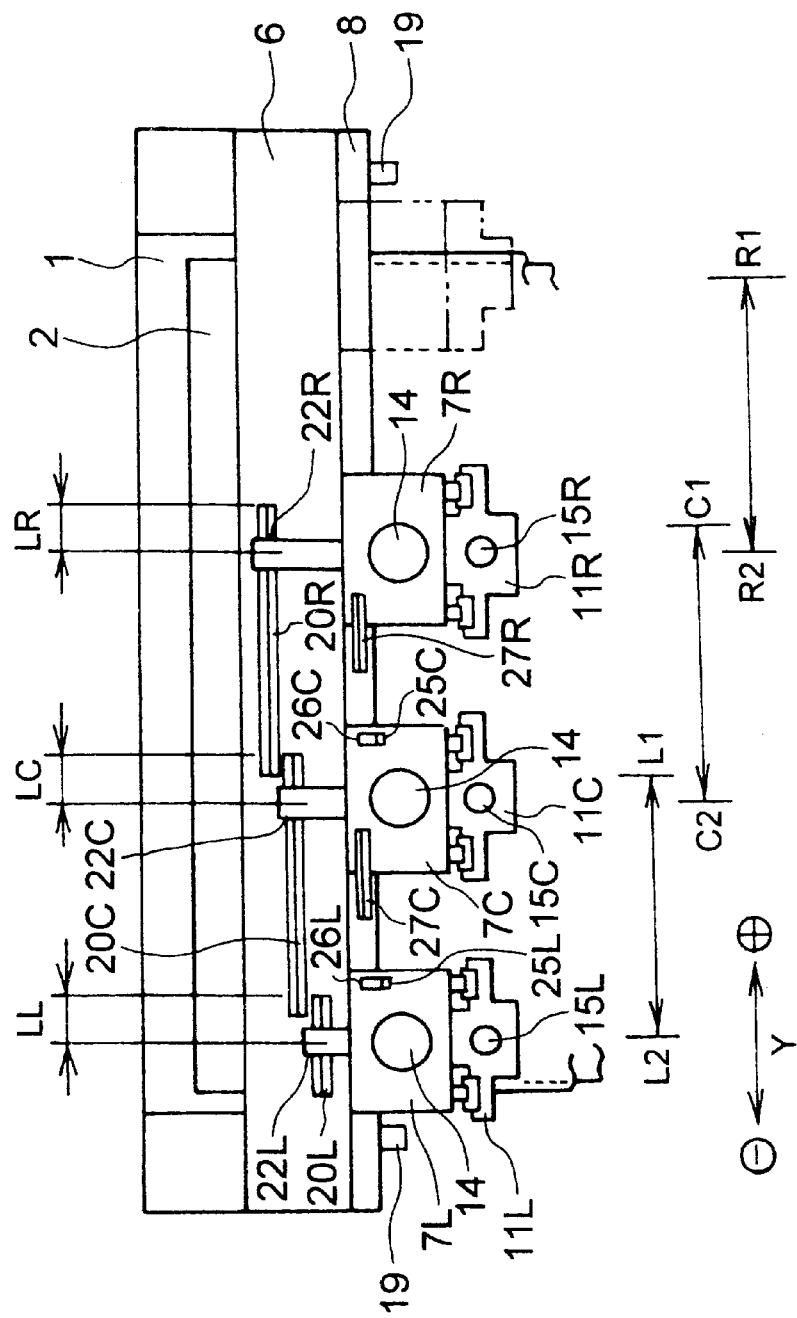
FIG. 3 is a plan view when the spindle units are located at a their respective home positions.

With this structure, the spindle unit 15R shares a machining zone from R1 to R2, the spindle unit 15C shares a machining zone from C1 to C2, and the spindle unit 15L shares a machining zone from L1 to L2, respectively, as shown in FIG. 3. Home positions of the spindle units 15R, 15C, 15L are respectively located at positions LR, LC, LL from the right ends of corresponding dogs 20R, 20C, 20L.

When the spindle units 15R, 15C, and 15L are located at their home positions and an electric current is applied to the coil 18R (or 18C, or 18L) in accordance with a command of a control unit (not shown), the slider 7R (or 7C, or 7L) on which the coil 18R (or 18C, or 18L) is fixed is moved along the guide means 8 to move the spindle unit 15R (or 15C, or 15L) to a machining position.

At this time, the control unit monitors positions of the sliders 7R, 7C, 7L to control so that the sliders 7R, 7C, 7L may not interfere with each other because the machining zones of adjacent sliders 7R and 7C as well as 7C and 7L overlap in part.

When a printed circuit board 16 to be machined and the spindle unit 15R (or 15C, or 15L) are positioned by relative movement between the table 2 carrying the printed circuit board 16 thereon and the slider 7R (or 7C, or 7L) in the X- and Y-directions, the motor 14 is activated to feed the spindle unit 15R (or 15C, or 15L) in the Z-direction to drill the printed circuit board 16.

By repeating relative movement between the table 2 and the slider 7R (or 7C, or 7L) in the X- and Y-directions as well as movement of the spindle unit 15R (or 15C, or 15L) in the Z-direction as described above, holes designated by program are drilled in the printed circuit board 16.

The sliders 7R, 7C, 7L are merely movably supported by the guide means 8, and therefore, they are moved easily if a force is applied in the Y-direction. For example, if an operator stops the printed circuit board processing machine and replaces a broken drill, a position in the Y-direction of the slider 7R (or 7C, or 7L) supporting the spindle unit 15R (or 15C, or 15L) of which drill has been exchanged may be changed. Therefore, when a power is applied and the printed circuit board processing machine is started again, the sliders 7R, 7C, 7L must be returned to their respective home positions.

Figure 4:
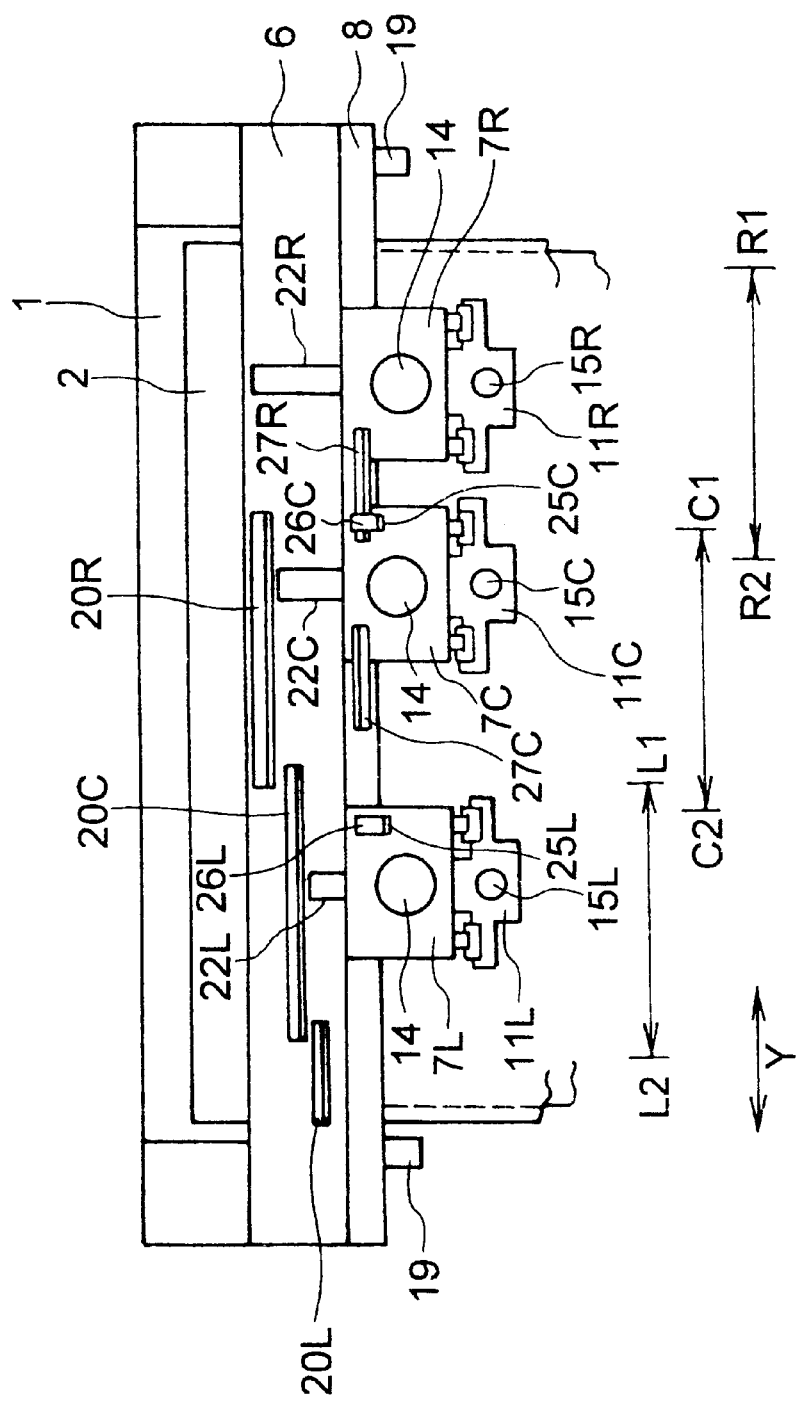
FIG. 4 is a plan view when the spindle units are located at any positions.
Figure 5:
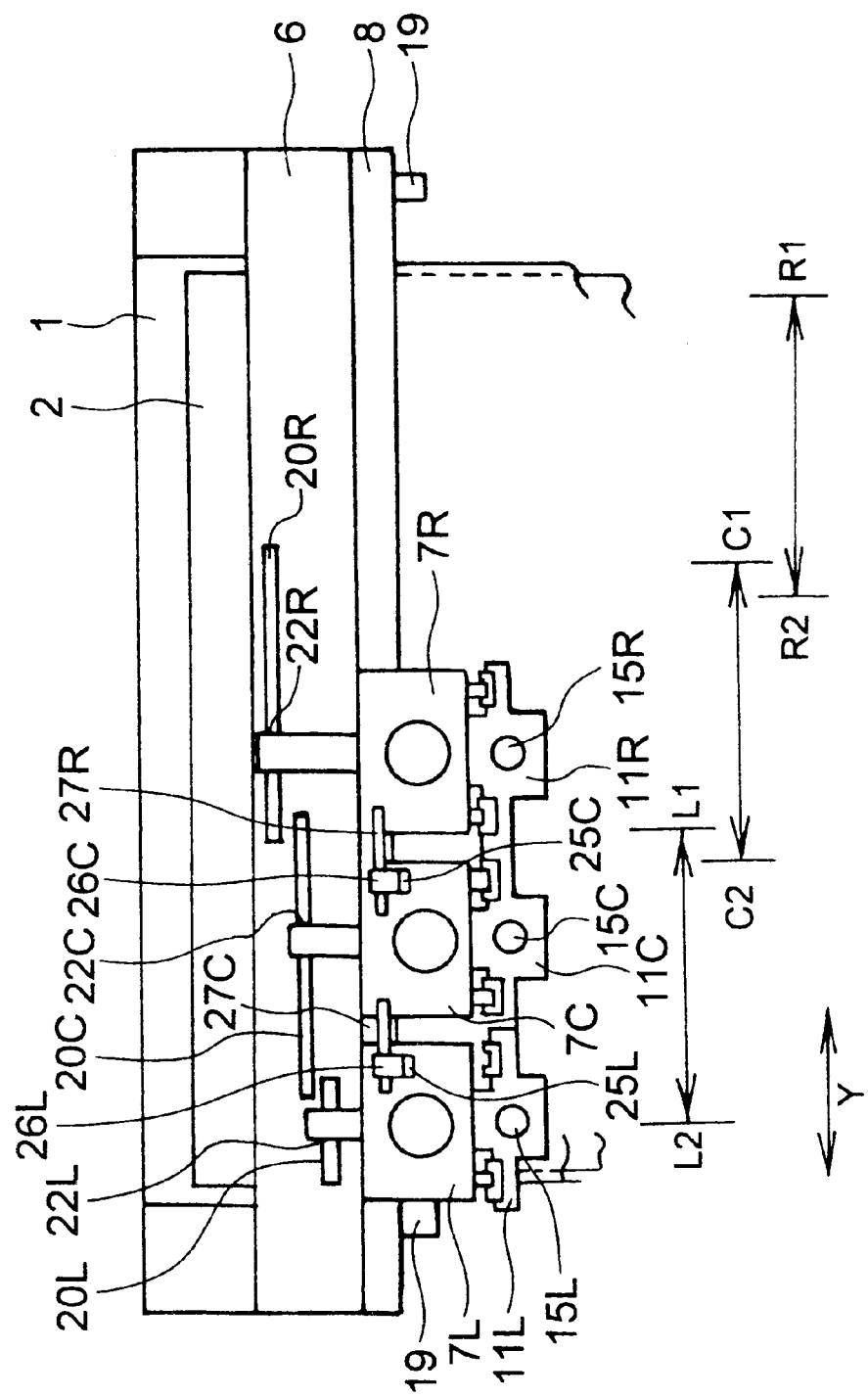
FIG. 5 is a plan view when the spindle units are located at any positions.
Figure 6:
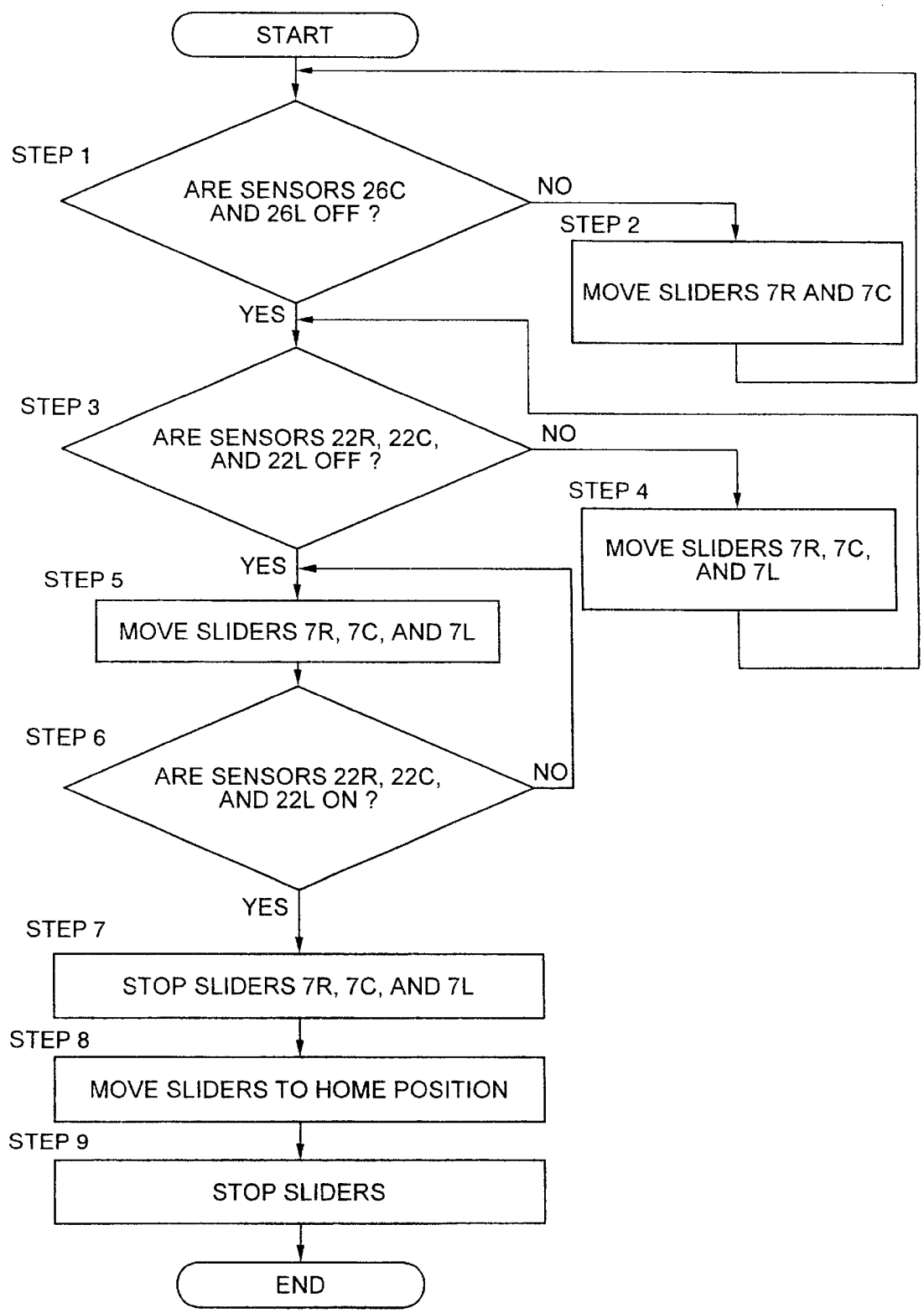
FIG. 6 is a flowchart showing an operation of returning to the home positions.

For example, as shown in FIGS. 4 and 5, if a command to return to home positions is issued when the sliders 7R, 7C, and 7L are located at any position, they are returned to their home positions according to the procedures shown in FIG. 6. In the following description, a state in which a light from the light projector of the transmission optical sensor is being received by the light receiver is regarded as an OFF state while a state in which the light is interrupted by the dogs is regarded as an ON state.

First, outputs of the sensors 26C, 26L are checked (Step S1). If either or both of the sensors 26C, 26L are ON, either or both sliders 7R, 7C on which the dogs 27R, 27C corresponding to the sensors 26C, 26L are fixed are moved in such directions that the spacing between the sliders 7R, 7C, 7L spread (Step S2).

If the outputs of both sensors 26C, 26L are OFF, the outputs of the sensors 22R, 22C, 22L are checked (Step S3). For example, when the sensors 22R, 22C, 22L are ON by being overlapped with the dogs 20R, 20C, 20L as shown in FIG. 5 or when one or two of the sensors 22R, 22C, 22C are ON, the sliders 7R, 7C, 7L on which the sensors 22R, 22C, 22L are fixed are moved toward their respective machining zones until the sensors 22R, 22C, 22L are turned OFF by being come off the dogs 20R, 20C, 20L (Step S4) as shown in FIG. 4.

While moving the sliders 7R, 7C, 7L to their respective home positions (Step S5), the respective outputs of the sensors 22R, 22C, 22L are monitored (Step S6). When the sensor(s) becomes ON, the slider(s) 7R, 7C, 7L holding the ON sensor(s) 22R, 22C, 22L is stopped (Step S7).

When all the sliders 7R, 7C, 7L are stopped, they are moved to their respective home positions (Step S8). While monitoring the outputs of the linear encoder heads 24R, 24C, 24L, the sliders 7R, 7C, 7L that have reached their home positions are stopped (Step S9).

When returning the sliders 7R, 7C, 7L to their home positions in the Y-axis direction, adjacent sliders 7R, 7C or 7C, 7L may interfere with each other in a case where the spacing among the sliders 7R, 7C, 7L at starting of movement are less than a predetermined spacing, since they do not move at the same speed even if they are moved simultaneously.

If the value of Kv is 80 (1/sec), speed is 1 m/sec, and speed variation rate is 7%, then the variation in an amount of travel of each of the sliders 7R, 7C, 7L per unit time is given by:

Droop amount=1 (m/sec)/80 (1/sec)=0.0125 m=12.5 mm, and

Variation amount in distance=12.5 mm×0.07 (%)×2 (axes)=1.75 mm.

Thus, interference among the sliders 7R, 7C, 7L can be prevented if the sliders 7R, 7C, 7L are moved with confirming that the spacing among the sliders 7R, 7C, 7L are 1.75 mm or more by using the sensors 26C, 26L and the dogs 27R, 27C.

In this way, high-precision machining can be ensured by returning the sliders 7R, 7C, 7L to their respective home positions and managing the distances from the home positions till respective machining positions with the linear encoder 23.

As described above, according to the invention, there is provided a printed circuit board processing machine comprising a table that can travel in a X-direction carrying a printed circuit board thereon; a cross rail arranged so as to straddle the table; a plurality of sliders supported for independently movement in a Y-direction by the cross rail; a plurality of spindles supported for movement in a Z-direction by the sliders; a magnetic rail of a linear-motor fixed to the cross rail; and a plurality of coils of the linear-motor fixed to the sliders so as to oppose the magnetic rail, said processing machine being capable of using spindle units more than three independently driven in the Y-direction and improving machining efficiency.

Further, since the printed circuit board processing machine of the invention further comprises a linear encoder fixed to the cross rail; a plurality of linear encoder heads fixed to the sliders so as to correspond to the linear encoder; a plurality of first dogs for returning to home positions, fixed to the cross rail so as to correspond to the sliders; a plurality of first sensors fixed to the sliders so as to correspond to the first dogs; a plurality of second dogs for interference prevention, fixed to one of adjacent sliders; and a plurality of second sensors fixed to the other of the adjacent sliders so as to correspond to the second dogs, it is possible to effect high precision process.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A printed circuit board processing machine comprising: a table that can travel in a X-direction carrying a printed circuit board thereon; a cross rail arranged so as to straddle the table; at least three sliders supported for independent movement in a Y-direction by the cross rail and arranged to have overlapping machining zones; at least three spindles supported for independent movement in a Z-direction by the sliders which are capable of driving at least three of the spindles without interference; a magnetic rail of a linear-motor fixed to the cross rail; a plurality of coils of the linear-motor fixed to the sliders so as to oppose the magnetic rail, wherein a linear encoder is fixed to the cross rail; a plurality of linear encoder heads are fixed to the sliders so as to correspond to the linear encoder; a plurality of first dogs for interference prevent among the sliders and spindles are fixed to one of adjacent sliders; and a plurality of first sensors is fixed to the other of the adjacent sliders so as to correspond to the first dogs.

2. printed circuit board processing machine according to claim 1, further comprising a plurality of second dogs for returning to home positions, said second dogs being fixed to the cross rail so as to correspond to the sliders; and a plurality of second sensors operatively fixed to the sliders so as to correspond to the second dogs.

* * * * *